United States Patent
Lewis et al.

(10) Patent No.: US 6,389,440 B1
(45) Date of Patent: May 14, 2002

(54) ACOUSTIC FEEDBACK CORRECTION

(75) Inventors: Alwyn V Lewis, Suffolk; Jonathan E Ensor, Lancashire, both of (GB)

(73) Assignee: British Telecommunications public limited company, London (GB)

( * ) Notice: Subject to any disclaimer, the term of this patent is extended or adjusted under 35 U.S.C. 154(b) by 0 days.

(21) Appl. No.: 09/029,577

(22) PCT Filed: Apr. 2, 1997

(86) PCT No.: PCT/GB97/00937

§ 371 Date: Mar. 6, 1998

§ 102(e) Date: Mar. 6, 1998

(87) PCT Pub. No.: WO97/38552

PCT Pub. Date: Oct. 16, 1997

(30) Foreign Application Priority Data

Apr. 3, 1996 (EP) .............................................. 96302351

(51) Int. Cl.[7] .............................................. G06F 17/10
(52) U.S. Cl. ................ 708/322; 381/71.11; 379/406.08
(58) Field of Search .............................. 381/83, 93, 66, 381/71.1, 71.11, 71.12, 71.13, 71.14, 94.1, 94.2, 94.3; 379/406, 410, 411, 406.08; 708/322; 370/290

(56) References Cited

U.S. PATENT DOCUMENTS

| | | | | |
|---|---|---|---|---|
| 5,295,136 A | * | 3/1994 | Ashley et al. | 379/411 |
| 5,305,307 A | * | 4/1994 | Chu | 379/406 |
| 5,329,472 A | * | 7/1994 | Sugiyama | 708/322 |

(List continued on next page.)

FOREIGN PATENT DOCUMENTS

| | | |
|---|---|---|
| EP | 0301627 A1 | 2/1989 |
| EP | 301 627 | 2/1989 |
| EP | 531 796 | 3/1993 |
| EP | 0531796 A2 | 3/1993 |
| EP | 661 832 | 7/1995 |
| EP | 0661832 A2 | 7/1995 |
| EP | 0698986 A2 | 8/1995 |
| EP | 698 986 | 2/1996 |
| JP | 59-161995 | * 9/1984 .................. 381/93 |
| JP | 64-12728 | * 1/1989 .................. 381/66 |
| WO | 92 12583 | 7/1992 |

OTHER PUBLICATIONS

Proceedings of the International Conference on Acoustics, Speech, Signal Processing (ICASSP), Speech Processing 2, Audio, Underwater Acoustics, VLS1 and Neural Networks, Adelaide, Apr. 19–22, 1994, vol. 2, Apr. 19, 1994, Institute of Electrical and Electronics Engineers, pp. II–249–II–252, Perez Meana et al, "A Time Varying Step Size Normalized LMS Echo Canceler Algorithm".

(List continued on next page.)

Primary Examiner—Xu Mei
(74) Attorney, Agent, or Firm—Nixon & Vanderhye P.C.

(57) ABSTRACT

In a video conference facility, an echo cancelling device is provided which comprises an adaptive finite impulse response filter operable to sample the input signal to a loudspeaker and to model, on the basis of that signal, the signal fed back to a microphone. The echo cancelling device further comprises a combiner for subtracting the model feedback signal from the microphone output signal and to provide a corrected microphone output signal, and a microprocessor programmed to read the corrected and uncorrected microphone output signal and to compute updates to the weights of the filter, the computation including a multiplication by a variable scaling factor which varies in accordance with the ratio of a first value indicative of the long-term average power of the sound being fed back to a second value indicative of the short-term average power of the sound being fed back. In this way, undesirable fluctuations in the modelled output signal which cause unnatural sounding echoes at the other video conference site are reduced.

18 Claims, 3 Drawing Sheets

U.S. PATENT DOCUMENTS

| | | | |
|---|---|---|---|
| 5,467,394 A | | 11/1995 | Walker |
| 5,570,423 A | * | 10/1996 | Walker et al. ............... 379/410 |
| 5,602,913 A | * | 2/1997 | Lee et al. .................... 379/406 |
| 5,644,641 A | * | 7/1997 | Ikeda ......................... 381/94.1 |
| 5,664,019 A | * | 9/1997 | Wang et al. ................... 381/93 |
| 5,699,424 A | * | 12/1997 | Hirano .................... 381/71.11 |
| 5,737,409 A | * | 4/1998 | Inoue .......................... 379/410 |
| 5,748,751 A | * | 5/1998 | Janse et al. ................... 381/83 |

OTHER PUBLICATIONS

Widrow, "Adaptive Filters", in "Aspects of Networking Systems and Theory", de Claris et al, eds., Holt, Rinehart & Winston, New York (1971).

Bershad, "Analysis of the Normalized LMS Algorithm With Gaussian Inputs", 1986 IEEE Transactions on Acoustics, Speech, and Signal Processing, vol. ASSP–34, No. 4.

Ochiai et al, "Echo Canceler with Two Echo Path Models", IEEE Transactions on Communications, vol. COM–25, No. 6, Jun. 1977.

Widrow et al, "Adaptive Signal Processing", pp. 103–114, Prentice Hall Inc., New Jersey, (1985).

Meana et al, "A Time Varying Step Size Normalized LMS Echo Canceler Algorithm", IEEE International Conference on Acoustics, Speech and Signal Processing, Apr. 19–22, 1994.

* cited by examiner

ACOUSTIC FEEDBACK CORRECTION

BACKGROUND OF THE INVENTION

1. Field of the Invention

The present invention relates to an adaptive filter apparatus for correcting acoustic feedback. It has particular utility in relation to echo cancellation in a video conferencing facility.

2. Description of the Related Art

A common situation where acoustic feedback causes a problem involves a public address apparatus where speech input to a microphone is amplified before being output from a nearby loudspeaker. Since a closed loop can be formed if an acoustic path exists between the loudspeaker and the microphone, there is a possibility that the signal from the loudspeaker can be fed back to the microphone to once again be amplified and output from the loudspeaker. If the microphone is placed too close to the loudspeaker, or the output of the loudspeaker is too loud, then the gain around the closed loop can exceed unity whereupon the loudspeaker will produce the howling sound associated with acoustic feedback.

Another situation in which acoustic feedback can present a problem involves a two-way link between two sites. In this case, a combination of a loudspeaker and a microphone is provided at each site. The problem which then arises is that any feedback from the loudspeaker to the microphone at one site will cause the person speaking into the microphone at the other site to hear an echo of his or her voice. This problem is particularly acute in relation to video conferencing facilities where a long delay in the arrival of the echo is caused by the speech signal being delayed to match the time taken in compressing the video signal which accompanies the voice signal. Because this delay is considerably longer than the length of a syllable, even a relatively quiet echo will make speaking into the microphone difficult. One technique which is used to reduce acoustic feedback is to connect a filter between the loudspeaker input and the microphone output. The filter is arranged to model the acoustic path between the loudspeaker and the microphone, thereby providing a signal which is similar to that which is received at the microphone from the loudspeaker. Once the signal has been provided, it can be subtracted from the microphone output signal to provide a corrected microphone output signal without the feedback component.

A further problem associated with video conference facilities is that the acoustic path between the loudspeaker and the microphone at each site is not constant. For example, the present inventors have shown that if a person present at a video conference session leans back in his or her chair, this can have a significant effect on the nature of the acoustic path between the loudspeaker and the microphone. It is therefore known to provide an adaptive filter which attempts to adapt its model of the acoustic path between the loudspeaker and the microphone as that acoustic path changes. Normally, such adaptive filters are implemented using a finite impulse response filter whose weights are updated on the basis of the previously mentioned corrected signal.

The speed at which the filter is able to adapt its model of the acoustic path is determined, at least in part, by the amount by which the filter weights may be changed in a single update. However, if the amount by which the weights may be changed is increased in order to speed up the adaptation of the filter, the filter is then less able to model the acoustic path accurately. This is because, even if the acoustic path remains constant for a substantial length of time, the filter weights do not settle to ideal values but rather fluctuate within a wide spread of values around the ideal values. Thus, conventionally, a compromise must be made between the speed of adaptation and the fluctuation which occurs once the filter has adapted to the changed acoustic path. It has been found that the presence of the fluctuation leads to so-called "misadjustment noise". If the loudspeaker input signal is speech then "misadjustment noise" leads to an unnatural sounding residual echo.

In addition, the speed of adaptation of conventional apparatuses has been found to depend on the nature of the loudspeaker input signal. If the input signal is speech or music, then the speed of adaptation is slower than when the input signal is white noise. Since an echo canceller in an audio-conferencing environment usually operates on a speech signal the speed of adaptation of such echo cancellers is relatively slow.

Another problem arises because the gain of the acoustic path between the loudspeaker and the microphone is usually frequency dependent. For example, it is possible that the gain around the closed loop will be −40 dB for some frequencies in the audible spectrum whilst only being −10 dB for other frequencies. In such a case, as the loudspeaker volume were increased acoustic feedback would initially occur only at those other frequencies, thereby causing a ringing noise to be heard, which would become progressively louder until the limits of the loudspeaker performance were reached. Generally, feedback will occur first at frequencies at which the closed loop gain is relatively high (high loop-gain frequencies) and then later at frequencies at which the closed loop gain is relatively low (low loop-gain frequencies). The amount by which the closed loop gain can be increased before it reaches unity (and hence ringing or howling occurs) is known as the "gain margin". Plainly, it is desirable to increase the gain margin as far as possible, but to do this it is necessary to reduce feedback at all high loop-gain frequencies in the audible spectrum. Hitherto, many feedback cancelling apparatuses have made little improvement to the gain margin.

SUMMARY OF THE INVENTION

The present invention aims to alleviate some or all of the above problems.

According to a first aspect of the present invention there is provided a filter apparatus for correcting feedback from a loudspeaker to a microphone, said apparatus comprising:

an adaptive digital filter which, in use, receives an incoming signal and provides a modelled feedback signal for subtraction from an outgoing signal to provide a corrected outgoing signal; and means for changing the weights of said filter in accordance with an algorithm for reducing the difference between an actual feedback signal and said modelled feedback signal, each weight change including a variable scaling factor which varies in accordance with the ratio of a first value indicative of the long-term average power of the sound being fed back to a second value indicative of the short-term average power of the sound being fed back.

In order to provide an apparatus which is sufficiently fast, many feedback cancelling apparatuses implement simplified algorithms which involve assumptions which are largely invalid for signals, such as speech or music, which have statistical properties (e.g. global variance, variance as a function of frequency) which vary significantly in the short-term. The effect of the variable scaling factor of the present invention is to control the changes to the filter weights at times when such assumptions are failing. In this way, the present invention gives the advantage that the speed of adaptation can be improved when the signal is speech or music without a concomitant increase in the misadjustment noise that occurs once adaptation has been achieved.

In preferred embodiments of the present invention, the long-term average is taken over a period longer than 250 ms—this is effective to span variations in speech power which occur between one phoneme and the next.

Preferably, the short-term average is taken over a period shorter than 25 ms.

The first and/or second value may be derived using either the incoming signal or the outgoing signal. In advantageous embodiments, the outgoing signal is used as this accounts for the nature of the acoustic path between the loudspeaker and the microphone.

Preferably, said first value represents the mean of the unsigned value of m samples of said outgoing signal previous to said weight change and said second value represents the mean of the unsigned value of n samples of said outgoing signal previous to said weight change, where m is greater than n. This arrangement has the advantage that said scaling factor may be easily computed.

In preferred embodiments of the present invention, the said m samples comprise all previous samples taken in the current period of operation of the apparatus.

In some embodiments of the present invention, n equals 1, the second value thus being the unsigned value of current sample of the microphone output signal. This has the advantage that the computational requirements of the apparatus are further reduced.

In preferred embodiments of the present invention, n is greater than 1.

The advantage of increasing the magnitude of n is that the stability of the model of the feedback path is increased.

Advantageously, said search algorithm may be a least mean squares gradient search algorithm. In the operation of a least mean squares algorithm, it is assumed that the instantaneous squared error is equal to the mean squared error. In other words, it is assumed that the instantaneous value of the squared corrected outgoing signal is identical to the mean value of the squared corrected outgoing signal. This assumption is an assumption which fails when the statistical parameters of the incoming signal are non-stationary, e.g. when the incoming signal represents a speech signal. The presence of the scaling factor of the present invention compensates for the invalidity of that assumption in those circumstances.

Preferably, if said second value is less than a threshold value then said second value is set to said threshold value. This arrangement has the advantage that large changes to the weights as a result of very low values of the outgoing signal are avoided.

Preferably, if the power of said incoming signal is less than an incoming signal power threshold value then said second value is set to a predetermined value. This arrangement has the advantage that problems caused by local noise masking the remote signal are alleviated.

Preferably, said threshold value is varied during the operation of the apparatus. This is advantageous because it enables the size of the changes to the weights to be limited once the filter is correctly modelling the changed acoustic path, thus preventing excessive misadjustment noise, whilst not limiting the speed of the adaptation by limiting the magnitude of the changes made to the weights during the early stages of the adaptation.

Advantageously, an additional increment may be made to each of said weights, which additional increment is not dependent on said scaling factor, and said weight change and said additional increment are added in predetermined proportions to provide the total increment for each weight. This arrangement has the advantage that the weight change in accordance with the algorithm implemented in the present invention may be mixed with the weight change in accordance with another algorithm. The beneficial characteristics of the algorithm implemented by the present invention can be maintained whilst its deficiencies can be alleviated by the influence of the other algorithm.

According to a second aspect of the present invention there is provided an echo cancelling apparatus comprising a filter apparatus wherein said adaptive filter provides a first modelled feedback signal for subtraction from the outgoing signal to provide a first corrected outgoing signal.

Preferably said echo cancelling apparatus further comprises:

a static filter which, in use, receives the incoming signal and provides a second modelled feedback signal for subtraction from the outgoing signal to provide a second corrected outgoing signal; and a comparator means for comparing said first and second corrected outgoing signals and outputting the lower of the two signals as a corrected outgoing signal; and means for substituting the weights of said adaptive filter into the static filter on said first corrected outgoing signal being lower than said second corrected outgoing signal.

The second aspect of the invention has the advantage that the accuracy with which the acoustic path is modelled is improved, particularly when the feedback signal comprises speech.

According to a third aspect of the present invention there is provided a filter apparatus for correcting acoustic feedback from a loudspeaker to a microphone, said apparatus comprising:

means for splitting an incoming signal into a plurality of frequency-banded incoming signals;

means for splitting the outgoing signal into a plurality of frequency-banded outgoing signals;

a plurality of adaptive filters, operable to receive respective ones of said frequency-banded incoming signals, and to provide respective frequency-banded modelled frequency-banded feedback signals for subtraction from respective frequency-banded outgoing signals to provide respective frequency-banded corrected outgoing signals;

means for changing the weights of the filters in accordance with an algorithm for reducing the difference between the frequency-banded outgoing signals and respective frequency-banded modelled feedback signals, the weight changes including variable scaling factors which vary in accordance with the respective ratios of a first value indicative of the long-term average power within a frequency-band of the sound being fed back to a second value indicative of the short-term average power within the frequency-band. Of the sound being fed back; and means for combining said plurality of frequency-banded corrected outgoing signals to provide a corrected outgoing signal.

The third aspect of the present invention has the advantage that the speed of adaptation is improved whilst the level of computational complexity is reduced.

According to a fourth aspect of the present invention there is provided a method of providing a modelled feedback signal for correcting acoustic feedback from a loudspeaker to a microphone, said method comprising the steps of:

inputting the incoming signal into an adaptive filter, the output of said filter being a modelled feedback signal for subtraction from the outgoing signal to provide a corrected outgoing signal; and changing the weights of said filter in accordance with an algorithm for reducing the difference between the actual feedback signal and the modelled feedback signal, each weight update including a variable scaling factor which varies in accordance with the ratio of a first value indicative of the long-term average power of the sound being fed back to a second value indicative of the short-term average power of the sound being fed back.

Specific embodiments of the invention will now be described, by way of example only, with reference to the accompanying drawings, in which:

DESCRIPTION OF PREFERRED EMBODIMENTS

Figure 1:
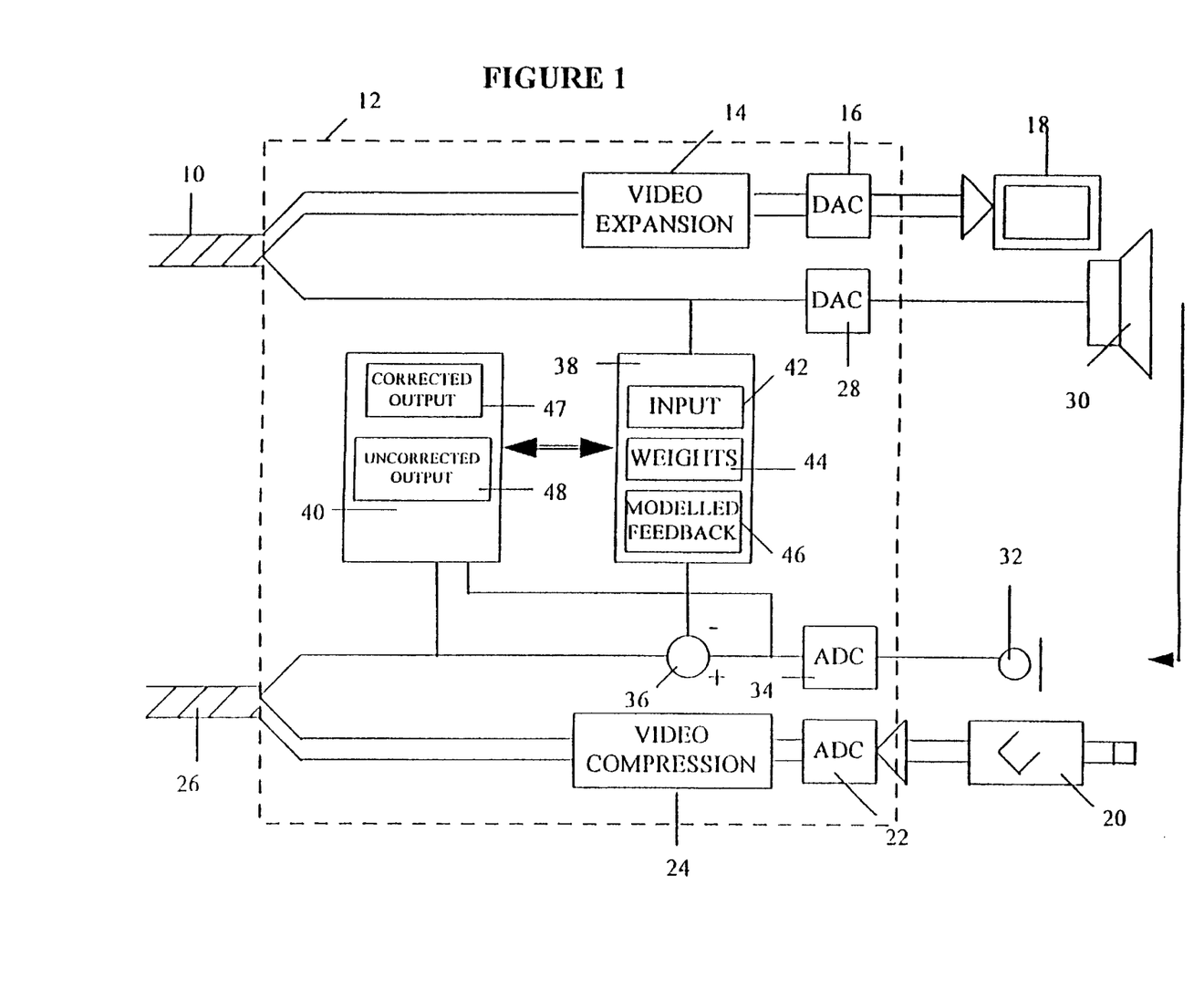
FIG. 1 is a schematic overview of the apparatus of a first embodiment of the present invention.

FIG. 1 shows the apparatus of the first embodiment of the present invention installed within a video conference room. An inbound copper cable 10 carries video and audio signals transmitted from the other site involved in the video conference into a coder/decoder 12. Within the coder/decoder 12 the video component of the signal is passed through a video expansion means 14 and a digital to analogue converter 16 before being output to one or more television monitors 18. One or more cameras 20 are also provided in the video conference room and the signals output from them are passed along coaxial cable to an input on the coder/decoder 12. Those signals are then passed via an analogue to digital converter 22 and a video compression means 24 situated in the coder/decoder 12 before being output to an outbound copper cable 26 for carrying the signals to the other site involved in the video conference.

The audio part of the inbound signal is passed through a second digital to analogue converter 28 before being output to a loudspeaker 30. A microphone 32 supplied within the video conference room and a wire pair carries signals from the microphone 32 into the coder/decoder 12 where the signals are converted into a digital format by an analogue to digital converter 34.

The wire leading from the audio analogue to digital converter 34 is interrupted by a signal combiner 36 before it continues to the outbound copper cable 26. The coder/decoder 12 also comprises a finite impulse response filter 38 whose input is connected to receive the inbound digital audio signal and whose output is connected to the combiner 36. In addition, a microprocessor 40 is connected so as to be able to read and write data to the finite impulse response filter 38 and so as to be able to receive the uncorrected microphone output signal output from the analogue to digital converter 34 and also the corrected microphone output signal output from the combiner 36.

The digital filter 38 has one eight kilobyte memory 42 for storing the last 4096 input samples and one twelve kilobyte memory 44 for storing the 4096 associated weights, and a register 46 for storing the current value of the modelled output signal. The microprocessor 40 has two registers 47, 48 for storing the current values of the uncorrected and corrected microphone output signal respectively.

Figure 2:
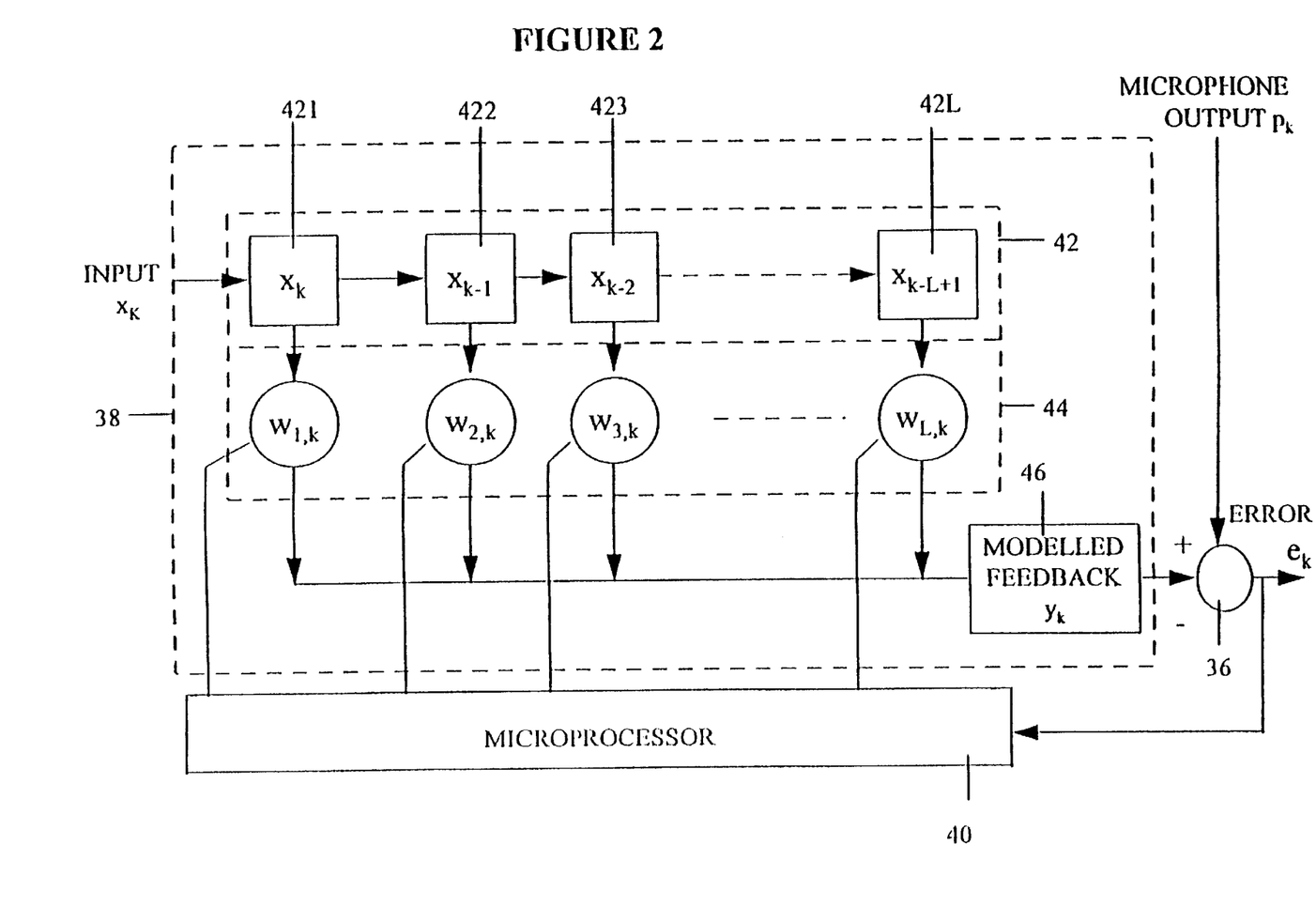
FIG. 2 is a schematic diagram illustrating the operation of the adaptive digital filter used in the first embodiment of the present invention.

FIG. 2 is a more detailed schematic illustration of the finite impulse response filter 38 and associated microprocessor 40. The first three and last of the 4096 positions (of two bytes each) making up the eight kilobyte memory 42 are shown as are the first three and last of the 4096 positions (of three bytes each) ($w_{1,k} \ldots w_{L,k}$) making up the twelve kilobyte weight memory 44.

In operation, the apparatus according to the first embodiment is firstly initialised in a conventional manner, that is to say the impulse response of the video conference room is recorded and then digitised at a sixteen kilohertz sample rate. The first 4096 values obtained are stored within the bytes making up the weight memory 44.

Once initialised, the finite impulse response filter operates by carrying out 16,000 cycles of operation per second. In each cycle of operation, the current value of the audio signal is input into one position 421 of the input memory 42, after previously read values of the input audio signal have, in effect, been shifted to a successive position within the memory 42. The finite impulse response filter 38 then calculates the product of each position (421, 422 . . . 42L) in the input memory 42 with an associated position ($W_{1,k} \ldots W_{L,k}$) in the weight memory 44. The current value for the output signal is then given by the sum of those products and is supplied to the register 46. According to the notation used in FIG. 2, the modelled output for the kth cycle of operation can be expressed mathematically as:

$$y_k = \sum_{l=1}^{L} w_{l,k} x_{k-l-1}$$

where L is the number of stored values of the input signal, in this case 4096.

Once the output from the finite impulse response filter 38 has been calculated, it is output to the combiner 36 where it is subtracted from the current value of the microphone output signal. The combiner 36 therefore outputs a "corrected" output signal towards the outbound copper cable 26.

In order to adapt the weights used within the finite impulse response filter 38, the microprocessor 40 inputs the current value of the microphone output signal $P_k$ and corrected microphone output signal $e_k$ during the kth cycle of operation of the finite impulse response filter 38. The microprocessor 40 then calculates the lth weight for the (k+1)th cycle of operation in accordance with the following equation:

$$w_{l,k+1} = w_{l,k} + \left\{ \frac{2\alpha e_k x_{k-l+1}}{\sum_{i=0}^{l-1} x_{k-i}^2} \right\} \cdot \frac{E[|p_k|]}{|p_k|}$$

where $w_{L,k}$ is the lth weight for the kth cycle of operation, $\alpha$ is a predetermined constant, and $E[|P_k|]$ is the average of all previous readings of the unsigned microphone output signal $p_k$, and the other elements are as defined above.

The weight values for the (k+1)th cycle of operation are then written by the microprocessor 40 to the weight memory 44 in readiness for the next cycle of operation. The result of repeating this cycle of operation 16000 times per second for several seconds is that the output signal $y_k$ models the signal fed back to the microphone. The subtraction of the filter output signal $y_k$ from the microphone output signal $p_k$ by the combiner means that the user of the video conference at the other site does not hear an echo of his own voice.

Those skilled in the art will recognise that if the scaling factor $$\frac{E[|p_k|]}{|p_k|}$$

were to be removed then the remainder of the weight change would be in accordance with a conventional least mean squares algorithm. This algorithm is based on the assumption that the instantaneous square error can be taken to be the mean squared error. As stated above, this assumption fails when the statistical parameters of the microphone output signal $p_k$ are non-stationary, e.g. when the microphone output signal comprises speech.

The advantage of using the above weight change is that the scaling factor causes the size of the changes made to the weights in each cycle of operation to be lessened if the instantaneous value of the microphone output signal is higher than average. By controlling the weight changes in this way, the performance of the apparatus is improved.

In a second preferred embodiment, a short-term average of the unsigned microphone output signal is used as the denominator in the scaling factor. This may, for example, be taken over the last 80 cycles of operation, or in other words over the previous five milliseconds of the microphone output signal. This is advantageous when compared to the first embodiment because the short-term average value of a fluctuating signal such as speech falls below the long-term average less often than the instantaneous value falls below the long-term average. Hence, whereas in the first embodiment the weight update will often be increased in the presence of a fluctuating signal (because the instantaneous value of the signal is less than the long-term average), this is less likely to occur in the second embodiment. Advantageously, this results in an increase in the stability of the adaptation of the apparatus.

In a third embodiment, the microprocessor 40 also carries out the function of comparing the unsigned value of the microphone output signal with a threshold value. The threshold value may, for example, be twice the level of the local room noise. If the unsigned value of the microphone output signal is less than the threshold value then the unsigned value of the microphone signal is replaced by the threshold value before the weight changes for that cycle of operation are calculated.

This overcomes a problem which may occur if the unsigned microphone output signal has the value zero in any given cycle of operation. For example, if this were to occur in relation to the first embodiment, then, on calculating the scaling factor, the microprocessor 40 will crash owing to an attempt to divide by zero. This problem is overcome by the third embodiment because the division will instead be by the threshold value.

In a preferred form of the third embodiment of the present invention, the threshold value is increased when the modelled feedback signal is closely modelling the microphone output signal. Hence, at the beginning of the adaptation, when the modelled feedback signal is significantly different from the microphone output signal, the threshold value is low and the size of the weight changes is not significantly controlled. This has the result that the speed of the adaptation of the modelled feedback signal to the microphone output signal is not adversely affected. Nevertheless, later on, when the modelled feedback signal is closely modelling the microphone output signal the threshold value is increased, thereby preventing large changes to the weights of the filter. As a result, the misadjustment noise owing to the operation of the filter is reduced. Hence it will be seen that the conventional compromise between the speed of adaptation and the presence of misadjustment noise is overcome by the preferred form of the third embodiment. In a fourth embodiment, the microprocessor 40 calculates the change to a given weight by first calculating a partial weight change without using the scaling factor, and then calculating a partial weight change using the scaling factor. The total weight change is then calculated by adding the partial weight changes in a predetermined proportion. This is achieved by a setting a biasing factor r to a value between 0 and 1 and then multiplying the first partial weight change by r and the second partial weight change by 1−r. The two partial weight changes may then be added to provide the total weight change.

The advantage of the fourth embodiment is that the biasing factor may be adjusted to provide preferred performance characteristics. By setting r greater than zero, the effect of the scaling factor on the adaptation can be reduced. This may be advantageous in that the stability of the modelled output signal can be improved.

Figure 3:
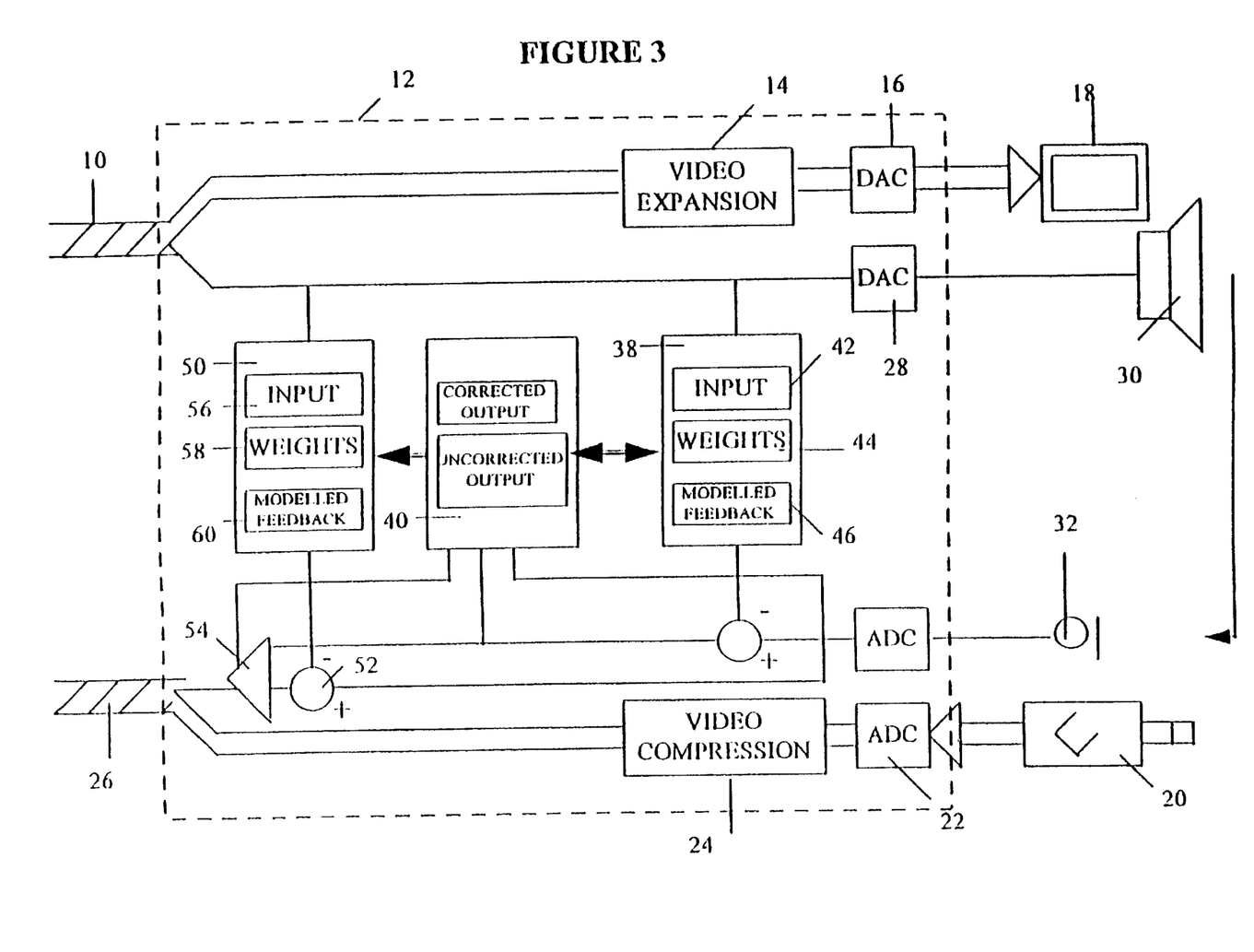
FIG. 3 is a schematic overview of the apparatus of a fifth embodiment of the present invention.

The apparatus of a fifth embodiment of the present invention is illustrated in FIG. 3. The apparatus of this embodiment is identical to that of the first embodiment save for the addition of a static filter 50 and associated components. The static filter 50 is similar to the adaptive filter 38 in that it has an eight kilobyte memory 56 for storing the last 4096 samples of the loudspeaker input signal, a twelve kilobyte memory 58 for storing 4096 associated weights and a register 60 for storing the current output value of a modelled feedback signal. The operation of the static filter 50 is similar to that of the adaptive filter 38 save that the microprocessor 40 does not change the weights of the static filter on the basis of the corrected microphone output signal provided by a second combiner 52. The static filter 50 provides a modelled feedback signal which is subtracted from the microphone output signal by the combiner 52 to provide a second corrected microphone output signal. Both the corrected microphone output signal from the combiner 36 and the second corrected microphone output signal from the second combiner 52 are passed to a comparator 54. The comparator 54 is operable to output the lower of the first or second corrected microphone output signals. A connection is also provided from the comparator 54 to the microprocessor 40 which carries a signal indicating which of the two corrected microphone output signals is the lower.

In operation, if the microprocessor 40 establishes that the first corrected microphone output signal is lower, i.e. that the adaptive filter 38 is providing a more accurate model of the feedback than the static filter 50, then the microprocessor 40 transfers the weight values from the adaptive filter 38 to the static filter 50. If however, the static filter 50 is providing a better model of the feedback path then the weights of the static filter are not altered. During each cycle of operation, the weights of the adaptive filter are changed as they are in relation to the first embodiment.

It is sometimes found that the accuracy of the model of the feedback path provided by the adaptive filter 38 decreases if there is a sudden change in the microphone output signal. The advantage of the present embodiment is that the spoiling effect of such a sudden change is prevented because the model provided by the static filter 50 is used until the accuracy of the model provided by the adaptive filter 38 again surpasses the accuracy of the model provided by the static filter 50.

According to a sixth embodiment of the present invention, quadrature mirror filters are used to split the loudspeaker input signal and microphone output signal into a high frequency signal and a low frequency signal. Two adaptive digital filters are provided, a first inputs the high frequency part of the loudspeaker input signal and provides the high frequency part of a modelled feedback signal. This modelled signal is then passed to a combiner where it is subtracted from the high frequency part of the microphone output signal to provide the high frequency part of a corrected microphone output signal. These last two signals are fed back to a microprocessor which then changes the weights of the first adaptive filter in accordance with the algorithm used in relation to the first embodiment. A second adaptive filter and a second combiner are provided to carry out similar operations with respect to the low frequency part of the signals involved. Both the high frequency part of the corrected microphone output signal and the low frequency part of the corrected microphone output signal are then passed through respective synthesis filters before being combined to provide the corrected microphone output signal to be passed along the outbound copper cable.

What is claimed is:

1. A filter apparatus for correcting feedback from a loudspeaker to a microphone, said apparatus comprising:

an adaptive digital filter which, in use, receives an incoming signal and provides a modelled feedback signal for subtraction from an outgoing signal to provide a corrected outgoing signal; and means for changing the weights of said filter in accordance with an algorithm for reducing the difference between an actual feedback signal and said modelled feedback signal, each weight change including a variable scaling factor which varies in direct accordance with the ratio of a first value indicative of the long-term average power of the sound being fed back to a second value indicative of the short-term average power of the sound being fed back.

2. A filter apparatus according to claim 1 wherein said long-term average is taken over a period longer than 250 ms.

3. A filter apparatus according to claim 1 wherein said short-term average is taken over a period shorter than 25 ms.

4. A filter apparatus according to claim 1, wherein said first and second values are derived from said outgoing signal.

5. A filter apparatus according to claim 4, wherein said first value represents the mean of unsigned respective values of m samples of said outgoing signal previous to said weight change and said second value represents the mean of unsigned respective values of n samples of said outgoing signal previous to said change, where m is greater than n.

6. A filter apparatus according to claim 5 wherein said first value represents the mean of the unsigned respective values of all previous samples of said outgoing signal obtained during the current period of operation of the apparatus.

7. A filter apparatus according to claim 5, wherein n=1, the second value being a current sample of said outgoing signal.

8. A filter apparatus according to claim 1, wherein said algorithm is a gradient search algorithm.

9. A filter apparatus according to claim 8, wherein said gradient search algorithm is a least mean squares algorithm.

10. A filter apparatus for correcting feedback from a loudspeaker to a microphone, said apparatus comprising:

an adaptive digital filter which, in use, receives an incoming signal and provides a modelled feedback signal for subtraction from an outgoing signal to provide a corrected outgoing signal; and means for changing the weights of said filter in accordance with an algorithm for reducing the difference between an actual feedback signal and said modelled feedback signal, each weight change including a variable scaling factor which varies in accordance with the ratio of a first value indicative of the long-term average power of the sound being fed back to a second value indicative of the short-term average power of the sound being fed back;

wherein said first and second values are derived from said outgoing signal; and if said second value is less than a threshold value then said second value is set to the threshold value.

11. A filter apparatus for correcting feedback from a loudspeaker to a microphone, said apparatus comprising:

an adaptive digital filter which, in use, receives an incoming signal and provides a modelled feedback signal for subtraction from an outgoing signal to provide a corrected outgoing signal; and means for changing the weights of said filter in accordance with an algorithm for reducing the difference between an actual feedback signal and said modelled feedback signal, each weight change including a variable scaling factor which varies in accordance with the ratio of a first value indicative of the long-term average power of the sound being fed back to a second value indicative of the short-term average power of the sound being fed back;

wherein said first and second values are derived from said outgoing signal; and if power of said incoming signal is less than an incoming signal power threshold value when said second value is set to a predetermined value.

12. A filter apparatus according to claim 10, wherein said threshold value is varied during the operation of the apparatus.

13. A filter apparatus according to claim 11 wherein said incoming signal power threshold value is varied during the operation of the apparatus.

14. A filter apparatus for correcting feedback from a loudspeaker to a microphone, said apparatus comprising:

an adaptive digital filter which, in use, receives an incoming signal and provides a modelled feedback signal for subtraction from an outgoing signal to provide a corrected outgoing signal; and means for changing the weights of said filter in accordance with an algorithm for reducing the difference between an actual feedback signal and said modelled feedback signal, each weight change including a variable scaling factor which varies in accordance with the ratio of a first value indicative of the long-term average power of the sound being fed back to a second value indicative of the short-term average power of the sound being fed back;

wherein a first partial weight change which is not dependent on said variable scaling factor, and a second partial weight change which is dependent on said variable scaling factor are added in predetermined proportions to provide said weight change.

15. An echo cancelling apparatus comprising a filter apparatus according to claim 1, wherein said adaptive filter provides a first modelled feedback signal for subtraction from the outgoing signal to provide a first corrected outgoing signal.

16. An echo cancelling apparatus comprising a filter apparatus for correcting feedback from a loudspeaker to a microphone, said filter apparatus comprising:

an adaptive digital filter which, in use, receives an incoming signal and provides a modelled feedback signal for subtraction from an outgoing signal to provide a corrected outgoing signal; and means for changing the weights of said filter in accordance with an algorithm for reducing the difference between an actual feedback signal and said modelled feedback signal, each weight change including a variable scaling factor which varies in direct accordance with the ratio of a first value indicative of the long-term average power of the sound being fed back to a second value indicative of the short-term average power of the sound being fed back;

wherein said adaptive filter provides a first modelled feedback signal for subtraction from the outgoing signal to provide a first corrected outgoing signal;

the echo cancelling apparatus further comprising:

a static filter which, in use, receives the incoming signal and provides a second modelled feedback signal for subtraction from the outgoing signal to provide a second corrected outgoing signal;

a comparator means for comparing said first and second corrected outgoing signals and outputting the lower of the two signals as a corrected outgoing signal; and means for substituting the weights of said adaptive filter into the static filter on said first corrected outgoing signal being lower than said second corrected outgoing signal.

17. A filter apparatus for correcting acoustic feedback from a loudspeaker to a microphone, said apparatus comprising:

means for splitting an incoming signal into a plurality of frequency-banded incoming signals;

means for splitting the outgoing signal into a plurality of frequency-banded outgoing signals;

a plurality of adaptive filters, operable to receive respective ones of said frequency-banded incoming signals, and to provide respective modelled frequency-banded feedback signals for subtraction from respective frequency-banded outgoing signals to provide respective frequency-banded corrected outgoing signals;

means for changing the weights of the filters in accordance with an algorithm for reducing the difference between the frequency-banded outgoing signals and respective modelled frequency-banded feedback signals, the weight changes including variable scaling factors which vary in direct accordance with the respective ratios of a first value indicative of the long-term average power within a frequency-band of the sound being fed back to a second value indicative of the short-term average power within the frequency-band of the sound being fed back; and means for combining said plurality of frequency-banded corrected outgoing signals to provide a corrected outgoing signal.

18. A method of providing a modelled feedback signal for correcting acoustic feedback from a loudspeaker to a microphone, said method comprising the steps of:

inputting the incoming signal into an adaptive filter, the output of said filter being a modelled feedback signal for subtraction from an outgoing signal to provide a corrected outgoing signal; and changing the weights of said filter in accordance with an algorithm for reducing the difference between the actual feedback signal and the modelled feedback signal, each weight update including a variable scaling factor which varies in accordance with the ratio of a first value indicative of the long-term average power of the sound being fed back to a second value indicative of the short-term average power of the sound being fed back.

* * * * *